(12) United States Patent
Li et al.

(10) Patent No.: US 10,483,283 B2
(45) Date of Patent: Nov. 19, 2019

(54) FLASH MEMORY DEVICE AND MANUFACTURE THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Shan Rong Li, Shanghai (CN); Min-hwa Chi, Shanghai (CN); Sheng Fen Chiu, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 0 days.

(21) Appl. No.: 16/379,422

(22) Filed: Apr. 9, 2019

(65) Prior Publication Data
US 2019/0237478 A1  Aug. 1, 2019

Related U.S. Application Data

(62) Division of application No. 15/797,884, filed on Oct. 30, 2017, now Pat. No. 10,297,609.

(30) Foreign Application Priority Data

Oct. 31, 2016 (CN) .......................... 2016 1 0925897

(51) Int. Cl.
*H01L 21/00* (2006.01)
*H01L 27/11582* (2017.01)
(Continued)

(52) U.S. Cl.
CPC .. *H01L 27/11582* (2013.01); *H01L 27/11556* (2013.01); *H01L 29/04* (2013.01);
(Continued)

(58) Field of Classification Search
CPC ......... H01L 27/11556; H01L 27/11582; H01L 29/04; H01L 29/16; H01L 29/47; H01L 29/7839; H01L 29/7889; H01L 29/7926
See application file for complete search history.

(56) References Cited

U.S. PATENT DOCUMENTS

2010/0213527 A1  8/2010  Shim et al.
2014/0264547 A1  9/2014  Kawai et al.
(Continued)

OTHER PUBLICATIONS

Jie Chen et al., "Schottky Barrier Controlled Conduction in Poly-Si TFTs with Mental Source and Drain," IEEE Transactions on Electron Devices, vol. 60, No. 6, Jun. 2013, 7 pages.
(Continued)

*Primary Examiner* — Samuel A Gebremariam
(74) *Attorney, Agent, or Firm* — Innovation Counsel LLP

(57) ABSTRACT

A flash memory device and its manufacturing method are presented. The flash memory device includes a substrate; a memory unit on the substrate, comprising a channel structure, wherein the channel structure comprises, sequentially from inner to outer of the channel structure, a channel layer comprising a first component substantially perpendicular to an upper surface of the substrate and a second component on the first component, a tunnel insulation layer wrapped around the channel layer, a charge capture layer wrapped around the tunnel insulation layer, and a blocking layer wrapped around the charge capture layer; a plurality of gate structures wrapped around the channel structure and arranged along a symmetry axis of the channel structure with a topmost gate structure wrapped around the second component; and a channel contact component connecting to, and forming a Schottky contact with, the second component of the channel layer. This device reduces the leakage current.

13 Claims, 11 Drawing Sheets

(51) Int. Cl.
   *H01L 29/04*     (2006.01)
   *H01L 29/16*     (2006.01)
   *H01L 29/47*     (2006.01)
   *H01L 29/78*     (2006.01)
   *H01L 29/788*    (2006.01)
   *H01L 29/792*    (2006.01)
   *H01L 27/11556*  (2017.01)

(52) U.S. Cl.
   CPC .............. *H01L 29/16* (2013.01); *H01L 29/47* (2013.01); *H01L 29/7839* (2013.01); *H01L 29/7889* (2013.01); *H01L 29/7926* (2013.01)

(56) References Cited

U.S. PATENT DOCUMENTS

| | | |
|---|---|---|
| 2016/0035741 A1 | 2/2016 | Tajima et al. |
| 2016/0079265 A1 | 3/2016 | Akutsu et al. |
| 2016/0126248 A1 | 5/2016 | Rabkin |

OTHER PUBLICATIONS

Jaehoon Jang, et al., "Vertical cell array using TCAT (Terabit Cell Array Transistor) Technology for Ultra High Density NAND Flash Memory," 2009 Symposium on VLSI Technology Digest of Technical Papers, 2 pages.

European Search Report, EP1719889, dated Mar. 20, 2018, 1 page.

FLASH MEMORY DEVICE AND MANUFACTURE THEREOF

CROSS-REFERENCE TO RELATED APPLICATIONS

This application is a divisional application of U.S. patent application Ser. No. 15/797,884 filed on Oct. 30, 2017, which claims priority to Chinese Patent Application No. 201610925897.8, filed on Oct. 31, 2016, and all the benefits accruing therefrom under 35 U.S.C. § 119, the contents of the prior applications being herein incorporated by reference.

BACKGROUND

(a) Field of the Invention

This inventive concept relates to semiconductor technologies, more specifically, a flash memory device and its manufacturing method.

(b) Description of the Related Art

3D NAND flash memory techniques are progressing rapidly in recent years and 3D NAND flash memory based on Terabit Cell Array Transistor (TCAT) is the latest development in this area. This type of flash memory comprises multiple serially-connected nonvolatile transistors, including a transistor on the top, known as the top transistor, for string select line (SSL) and a transistor on the bottom, known as the bottom transistor, for common source select line (CSL). The bottom transistor comprises a vertical channel portion and a horizontal channel portion on the substrate and can be turned on through a gate select line (GSL). The top transistor and the bottom transistor are manufactured simultaneously with other transistors.

Conventional 3D NAND flash memory devices have their limitations. Their performance is adversely affected by leakage current in the channel, and conventional 3D NAND flash memory devices, such as those based on TCAT, are manufactured before the Back End of Line (BEOL) process of a complete CMOS process flow. Additionally, a doping process in a silicon substrate is necessary to form a source electrode and a drain electrode for the bottom transistor (for CSL) during the manufacturing process, hence conventional 3D NAND flash memory devices can only be made on areas of silicon substrate separately from usual logic circuits. After 3D NAND is formed, then the BEOL for logic areas can be formed in a dielectric layer such as an inter-metal dielectric layer. Furthermore, the thermal cycles of 3D NAND process flow will be added to those for logic circuits and inevitably alter the characteristics of logic transistors. The manufacturing process of conventional 3D NAND flash memory devices is not compatible with that for logic circuits, i.e., it is difficult to integrate both 3D NAND and advanced CMOS logic circuits together on a same silicon substrate. The inventors of this inventive concept propose methods to form 3D NAND with logic circuits together on the same chip horizontally; furthermore, in this inventive concept, 3D NAND can also be vertically stacked over logic circuits as described below.

SUMMARY

This inventive concept presents a flash memory device that remedies at least one of the limitations described previously.

This inventive concept presents a flash memory device, comprising:
 a substrate; and
 a memory unit on the substrate, comprising:
  a channel structure on the substrate, wherein the channel structure comprises, sequentially from inner to outer of the channel structure, a channel layer, a tunnel insulation layer wrapped around the channel layer, a charge capture layer wrapped around the tunnel insulation layer, and a blocking layer wrapped around the charge capture layer, wherein the channel layer comprises a first component substantially perpendicular to an upper surface of the substrate and a second component on the first component;
  a plurality of gate structures wrapped around the channel structure and arranged along a symmetry axis of the channel structure, with a topmost gate structure wrapped around the second component of the channel layer; and
  a channel contact component connecting to the second component of the channel layer, wherein the channel contact component and the second component of the channel layer form a Schottky contact.

Additionally, in the aforementioned device, the conduction types of the first component and the second component of the channel layer may be opposite to each other.

Additionally, in the aforementioned device, the conduction types of the first component and the second component of the channel layer may be N-type and P-type, respectively, or P-type and N-type, respectively.

Additionally, in the aforementioned device, the channel layer may be made of polycrystalline silicon, the tunnel insulation layer may be made of silicon-based oxide, the charge capture layer may be made of silicon-based nitride, and the blocking layer may be made of silicon-based oxide.

Additionally, in the aforementioned device, the channel contact component may comprise:
 a top interface layer contacting the second component of the channel layer; and
 a metal filling layer on the top interface layer.

Additionally, in the aforementioned device, the conduction type of the second component of the channel layer may be P-type and the top interface layer may be a P-type work function regulation layer, or, the conduction type of the second component of the channel layer may be N-type and the top interface layer may be an N-type work function regulation layer.

Additionally, in the aforementioned device, the channel layer may further comprise a third component underneath the first component, with a bottommost gate structure wrapped around the third component.

Additionally, in the aforementioned device, the channel structure may further comprise a channel kernel being wrapped by the channel layer.

Additionally, the aforementioned device may further comprise a bottom interface layer on a portion of the substrate, wherein the bottom interface layer comprises a work function regulation layer, and wherein a portion of the memory unit is on the bottom interface layer and the channel layer contacts the bottom interface layer.

Additionally, in the aforementioned device, the conduction type of the first component of the channel layer may be N-type and the bottom interface layer may comprise an N-type work function regulation layer, or, the conduction type of the first component of the channel layer may be P-type and the bottom interface layer may comprise a P-type work function regulation layer.

Additionally, the aforementioned device may further comprise:

a plurality of memory units separating from each other;

a metal contact component contacting the bottom interface layer and located between the neighboring memory units; and a sidewall interval layer separating the metal contact component from the gate structures.

Additionally, in the aforementioned device, the memory unit may further comprise an interval insulation layer located between the neighboring gate structures.

This inventive concept further presents a method for manufacturing a flash memory device, comprising:

providing a substrate;

forming a plurality of sacrificial layers and a plurality of interval insulation layers on the substrate, with the sacrificial layers and the interval insulation layers stacking over each other alternately;

forming a through-hole by etching the sacrificial layers and the interval insulation layers until an upper surface of the substrate is exposed;

forming a channel structure in the through-hole, wherein the channel structure comprises, sequentially from inner to outer of the channel structure, a channel layer, a tunnel insulation layer wrapped around the channel layer, a charge capture layer wrapped around the tunnel insulation layer, and a blocking layer wrapped around the charge capture layer, wherein the channel layer comprises a first component substantially perpendicular to the upper surface of the substrate and a second component on the first component;

forming a plurality of interval cavities by removing the sacrificial layers;

forming a plurality of gate structures in the interval cavities, with a topmost gate structure wrapped around the second component of the channel layer; and forming a channel contact component contacting the second component of the channel layer, wherein the channel contact component and the second component of the channel layer form a Schottky contact.

Additionally, in the aforementioned method, the conduction types of the first component and the second component of the channel layer may be opposite to each other.

Additionally, in the aforementioned method, the conduction types of the first component and the second component of the channel layer may be N-type and P-type, respectively, or P-type and N-type, respectively.

Additionally, in the aforementioned method, the channel layer may be made of polycrystalline silicon, the tunnel insulation layer may be made of silicon-based oxide, the charge capture layer may be made of silicon-based nitride, and the blocking layer may be made of silicon-based oxide.

Additionally, in the aforementioned method, the channel contact component may comprise:

a top interface layer contacting the second component of the channel layer; and a metal filling layer on the top interface layer.

Additionally, in the aforementioned method, the conduction type of the second component of the channel layer may be P-type and the top interface layer may be a P-type work function interface layer, or, the conduction type of the second component of the channel layer may be N-type and the top interface layer may be an N-type work function interface layer.

Additionally, in the aforementioned method, the channel layer may further comprise a third component underneath the first component, with a bottommost gate structure wrapped around the third component.

Additionally, in the aforementioned method, the channel structure may further comprise a channel kernel being wrapped by the channel layer.

Additionally, in the aforementioned method, forming a channel structure in the through-hole may comprise:

forming the blocking layer on a side surface of the through-hole;

forming the charge capture layer on a side surface of the blocking layer;

forming the tunnel insulation layer on a side surface of the charge capture layer;

forming the channel layer on a side surface of the tunnel insulation layer and the bottom of the through-hole, wherein the channel layer comprises the first component substantially perpendicular to the upper surface of the substrate and a third component underneath the first component;

forming a channel kernel partially filling the through-hole on the channel layer, wherein an upper surface of the channel kernel is lower than an upper surface of the topmost sacrificial layer;

removing a portion of the channel layer higher than the channel kernel; and forming the second component of the channel layer connecting to the first component of the channel layer.

Additionally, in the aforementioned method, forming a channel structure in the through-hole may further comprise:

forming a top insulation layer covering the second component of the channel layer after the second component of the channel layer is formed, and forming a channel contact component comprises:

forming an opening exposing the second component of the channel layer by etching the top insulation layer; and forming the channel contact component in the opening.

Additionally, the aforementioned method may further comprise:

forming a bottom interface layer on a portion of the substrate before the sacrificial layers and the interval insulation layers are formed on the substrate, wherein the bottom interface layer comprises a work function regulation layer, and the sacrificial layers and the interval insulation layers are formed on the bottom interface layer, wherein when forming the through-hole, the through-hole exposes an upper surface of the bottom interface layer, and wherein when forming the channel structure, the channel layer contacts the bottom interface layer.

Additionally, in the aforementioned method, the conduction type of the first component of the channel layer may be N-type and the bottom interface layer may be an N-type work function interface layer, or, the conduction type of the first component of the channel layer may be P-type and the bottom interface layer may be a P-type work function interface layer.

Additionally, the aforementioned method may further comprise:

forming a channel groove exposing the upper surface of the bottom interface layer by etching the sacrificial layers and the interval insulation layers after the channel structure is formed but before the sacrificial layers are removed;

forming a sidewall interval layer on a side surface of the channel groove after the gate structures are formed but before the channel contact component is formed; and forming a metal contact component contacting the bottom interface layer in the channel groove after the sidewall interval layer is formed.

BRIEF DESCRIPTION OF THE DRAWINGS

The drawings describe some embodiments of this inventive concept and are used to describe this inventive concept together with the specification.

DETAILED DESCRIPTION OF THE EMBODIMENTS

Figure 1:
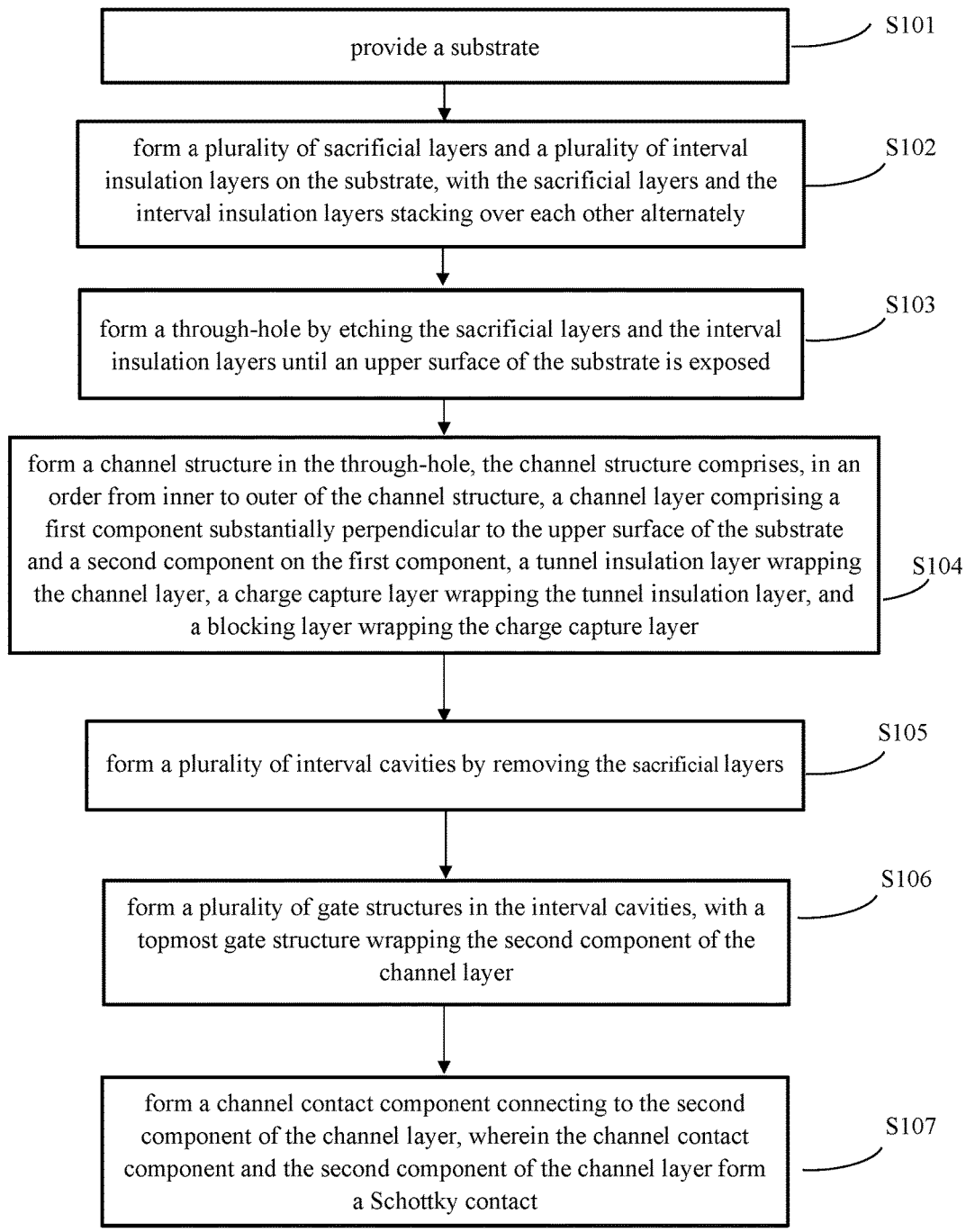
FIG. 1 shows a flowchart illustrating a flash memory manufacturing method in accordance with one or more embodiments of this inventive concept.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

FIG. 1 shows a flowchart illustrating a flash memory manufacturing method in accordance with one or more embodiments of this inventive concept.

In step S101, provide a substrate.

In step S102, form a plurality of sacrificial layers and a plurality of interval insulation layers on the substrate, with the sacrificial layers and the interval insulation layers stacking over each other alternately.

In step S103, form a through-hole by etching the sacrificial layers and the interval insulation layers until an upper surface of the substrate is exposed.

In step S104, form a channel structure in the through-hole, the channel structure comprises, sequentially from inner to outer of the channel structure, a channel layer, a tunnel insulation layer wrapped around the channel layer, a charge capture layer wrapped around the tunnel insulation layer, and a blocking layer wrapped around the charge capture layer. The channel layer comprises a first component substantially perpendicular to the upper surface of the substrate and a second component on the first component. The first component of the channel layer is considered substantially perpendicular to the upper surface of the substrate if an angle between the first component of the channel layer and the upper surface of the substrate is within an allowable range of a right angle, the allowable range may vary from several degrees to more than ten degrees and is not limited herein.

The channel layer may be made of semiconductor materials such as polycrystalline silicon, the tunnel insulation layer may be made of silicon-based oxide, the charge capture layer may be made of silicon-based nitride, and the blocking layer may be made of silicon-based oxide.

In one embodiment, the channel structure may further comprise a channel kernel being wrapped by the channel layer, wherein the channel kernel may be made of silicon-based oxide.

In step S105, form a plurality of interval cavities by removing the sacrificial layers.

In step S106, form a plurality of gate structures in the interval cavities, with a topmost gate structure wrapped around the second component of the channel layer.

In step S107, form a channel contact component connecting to the second component of the channel layer, wherein the channel contact component and the second component of the channel layer form a Schottky contact. The channel contact component may comprise a top interface layer contacting the second component of the channel layer and a metal filling layer on the top interface layer.

This manufacturing method forms a Schottky contact on a topmost transistor of the flash memory device, which results in a Schottky barrier between the channel contact component and the second component of the channel layer and reduces the leakage current. Additionally, when the topmost transistor is powered up, the Schottky contact becomes an Ohm contact, which can exert control over the leakage current.

In one embodiment, the conduction types of the first and the second components of the channel layer are opposite to each other. For example, the conduction types of the first and the second components of the channel layer can be P-type and N-type, respectively, or, N-type and P-type, respectively. Since the conductor types of the first and the second components of the channel layer are opposite to each other, the first and the second components of the channel layer form a diode that can further facilitate the control over the leakage current.

In one embodiment, the conduction type of the second component of the channel layer may be P-type, and the top interface layer may be a P-type work function regulation layer and may be made of titanium nitride (TiN). In another embodiment, the conduction type of the second component of the channel layer may be N-type, and the top interface layer may be an N-type work function regulation layer and may be made of titanium carbide (TiC) or titanium aluminum alloy (TiAl). The work function regulation layer and the second component of the channel layer form a Schottky contact, which further facilitates the control over the leakage current.

In one embodiment, the channel layer may further comprise a third component underneath the first component, with a bottommost gate structure wrapped around the third component of the channel layer.

In one embodiment, the manufacturing method may further comprise, before the sacrificial layers and the interval insulation layers are formed on the substrate, forming a bottom interface layer on a portion of the substrate, wherein the bottom interface layer comprises a work function regulation layer, and the sacrificial layers and the interval insulation layers are formed on the bottom interface layer. When forming a through-hole, the through-hole exposes an upper surface of the bottom interface layer. When forming a channel structure in the through-hole, the channel layer (e.g. the third component of the channel layer) contacts the bottom interface layer. The channel layer and the bottom interface layer may also form a Schottky contact, which may further reduce the leakage current and facilitate the control over the leakage current.

Additionally, in this embodiment, the bottom interface layer formed in the substrate may work as a source electrode or a drain electrode, which eliminates the need to, as in conventional manufacturing methods, dope the substrate to form a source electrode or a drain electrode. As a result, the flash memory manufacturing method of this inventive concept can be conducted not only on a silicon substrate, but also on a dielectric layer, and the flash memory manufactured by this method can be made compatible with BEOL.

In one embodiment, the conduction type of the first component of the channel layer is N-type, and the bottom interface layer may comprise an N-type work function regulation layer made of titanium carbide (TiC) or titanium aluminum alloy (TiAl). In another embodiment, the conduction type of the first component of the channel layer is P-type, and the bottom interface layer may comprise a P-type work function regulation layer made of titanium nitride (TiN).

In one embodiment, the manufacturing method may further comprise, after a channel structure is formed but before the sacrificial layers are removed, forming a channel groove exposing the upper surface of the bottom interface layer by etching the sacrificial layers and the interval insulation layers; after the gate structures are formed but before the channel contact component is formed, forming a sidewall interval layer on a side surface of the channel groove; and after the sidewall interval layer is formed, forming a metal contact component contacting the bottom interface layer in the channel groove. The metal contact component provides a connection to the bottom interface layer.

In some embodiments, the manufacturing method of this inventive concept may be conducted after Front End of Line (FEOL). For example, it may be conducted after a metal layer for contact and logic circuit has been formed. This inventive concept is not limited herein though.

FIGS. 2, 3, 4A, 4B, 5, 6, 7, 8, 9, 10, 11, 12, 13, 14, 15, 16, 17, 18, 19, and 20 show schematic cross-sectional views illustrating different stages of a flash memory manufacturing method in accordance with one or more embodiments of this inventive concept. Referring to these figures, this manufacturing method will be described in details.

Figure 2:
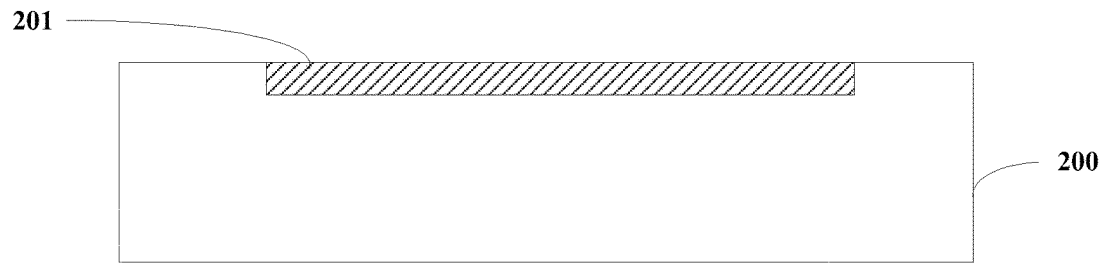
FIGS. 2, 3, 4A, 4B, 5, 6, 7, 8, 9, 10, 11, 12, 13, 14, 15, 16, 17, 18, 19, and 20 show schematic cross-sectional views illustrating different stages of a flash memory manufacturing method in accordance with one or more embodiments of this inventive concept.

First, referring to FIG. 2, a substrate 200 is provided. The substrate 200 may be a silicon substrate or a dielectric layer, such as a silicon-based oxide layer.

Then form a bottom interface layer 201 on a portion of the substrate 200. The bottom interface layer 201 may be embedded in the substrate 200, with an upper surface of the bottom interface layer 201 on a substantially same horizontal level with an upper surface of the substrate 200, as shown in FIG. 2. The upper surface of the bottom interface layer 201 and the upper surface of the substrate 200 are considered on a substantially same horizontal level if a difference between their horizontal levels is within an allowable range that won't obstruct the succeeding stages. The bottom interface layer 201 may be a work function regulation layer and may be made of titanium carbide (TiC).

In one embodiment, forming a bottom interface layer 201 may comprise: forming a substrate cavity in the substrate 200 by lithography or etching; forming a work function regulation layer filling the substrate cavity by a deposition process such as Physical Vapor Deposition (PVD); and forming the bottom interface layer 201 by conducting a planarization process such as Chemical Mechanical Planarization (CMP) on the substrate 200, as shown in FIG. 2.

Figure 3:
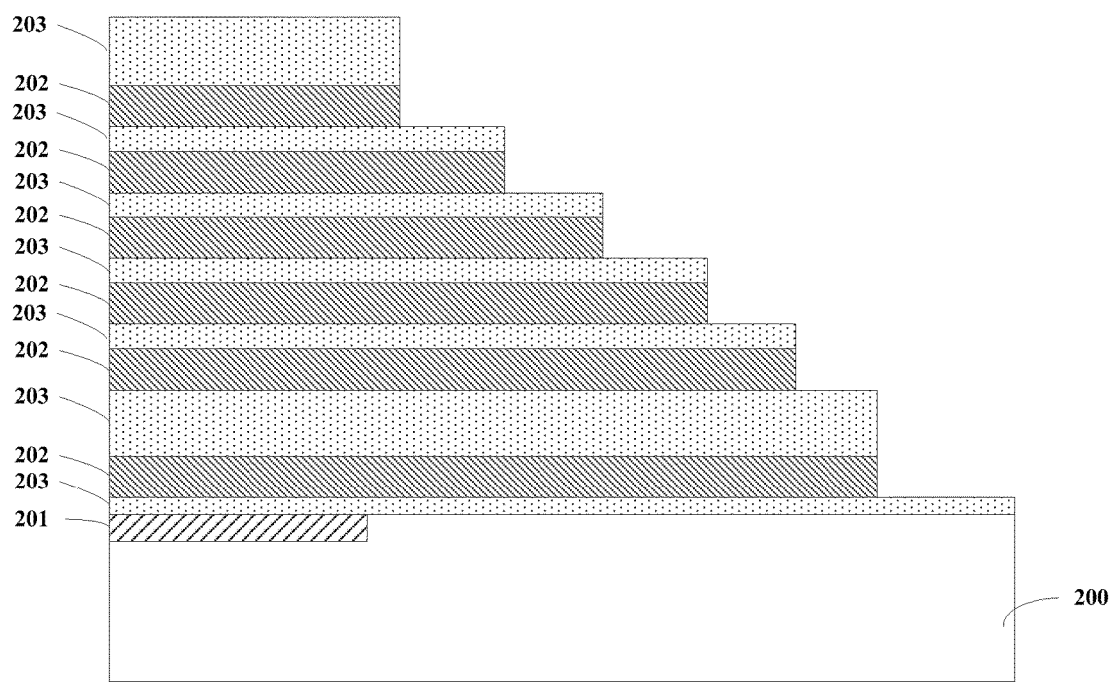

Referring to FIG. 3, a plurality of sacrificial layers 202 and a plurality of interval insulation layers 203 are formed on the bottom interface layer 201 by deposition, with the sacrificial layers 202 and the interval insulation layers 203 stacking over each other alternately. Form a stair pattern as shown in FIG. 3 by etching the sacrificial layers 202 and the interval insulation layers 203. The sacrificial layers 202 may be made of silicon nitride and the interval insulation layers 203 may be made of silicon dioxide. In one embodiment, an interval insulation layer 203 may be a bottommost layer in the multi-layer compound comprising the sacrificial layers 202 and the interval insulation layers 203. That is, when forming the sacrificial layers 202 and the interval insulation layers 203, an interval insulation layer 203 if first formed on the substrate 200 and the bottom interface layer 201, then a sacrificial layer 202 is formed on the interval insulation layer 203, then another interval insulation layer 203 is formed on the sacrificial layer 202, and so on. In one embodiment, the thickness of the bottommost interval insulation layer 203 is less than the thickness of the sacrificial layers 202.

It should be understood that, for conciseness purpose, FIG. 3 and other figures may only show a portion of the entire structure of the device in this inventive concept. For example, FIG. 3 only shows a portion of the bottom interface layer and the stair pattern comprising the sacrificial layers and the interval insulation layers. Hence the scope of this inventive concept should not be limited by the scopes of these figures.

Figure 4A:
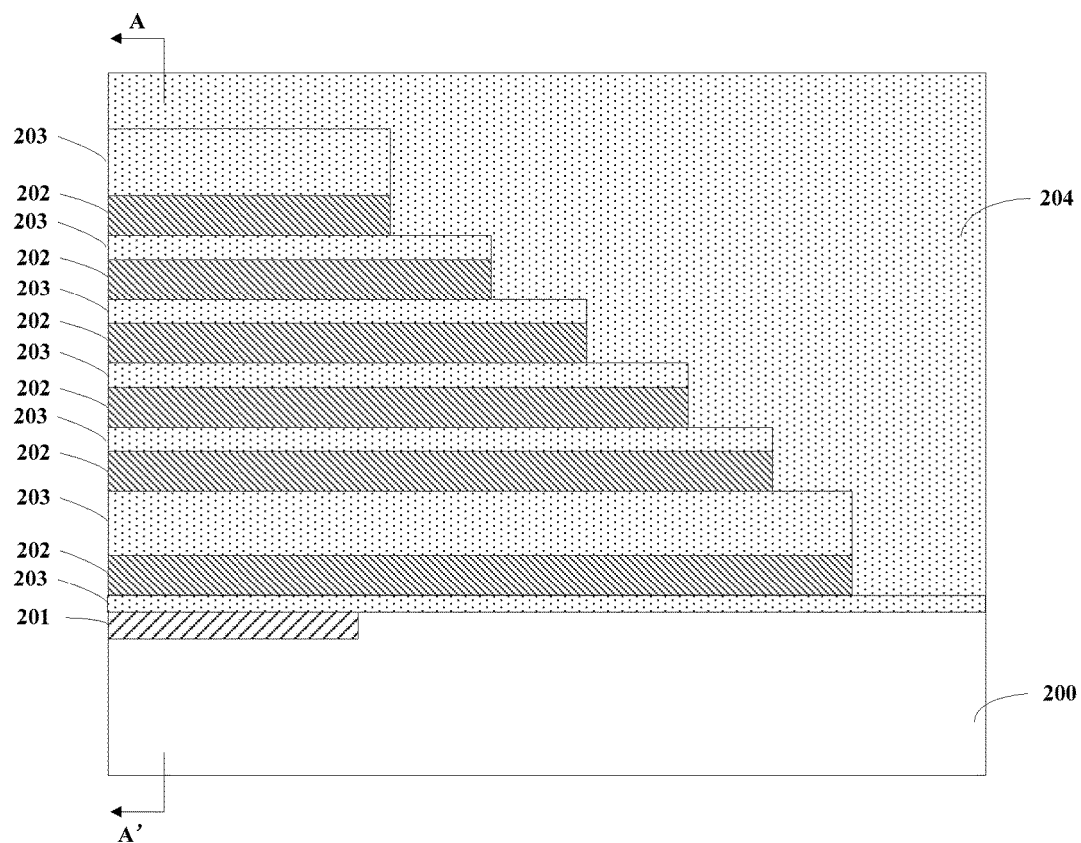
Figure 4B:
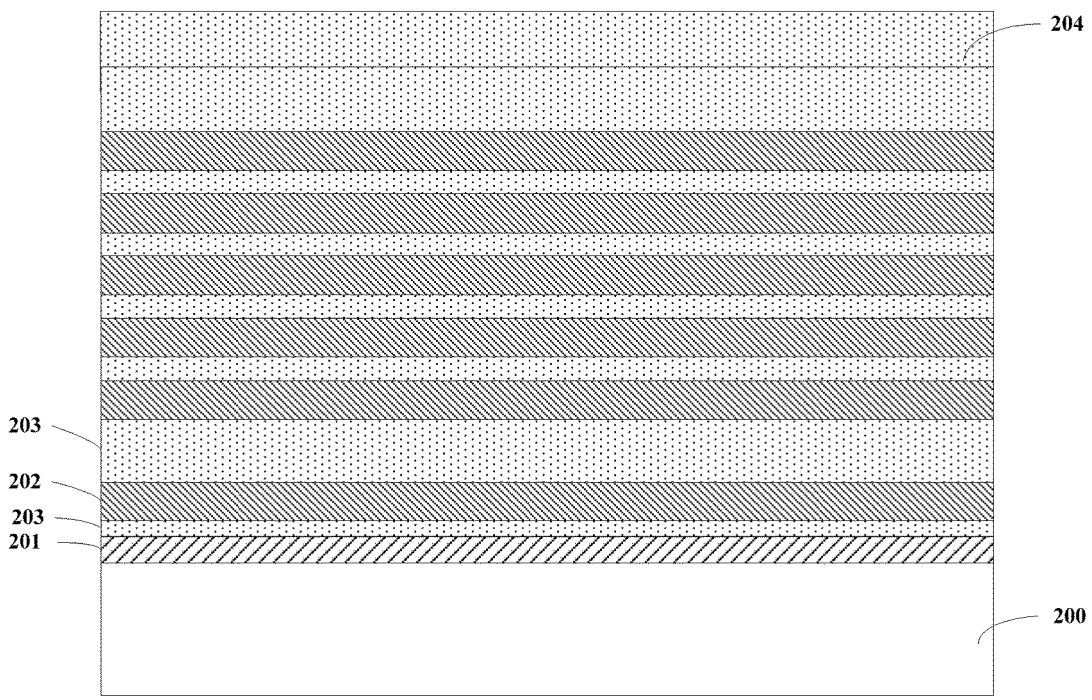

Referring to FIGS. 4A and 4B, optionally, a dielectric layer 204 may be formed on the stair pattern comprising the sacrificial layers 202 and the interval insulation layers 203. The dielectric layer 204 may be made of silicon dioxide. FIG. 4B shows a cross-sectional view of the structure of FIG. 4A on a plane perpendicular to the paper and goes through line A-A' in FIG. 4A, and viewed from a direction defined by the arrows in FIG. 4A.

Figure 5:
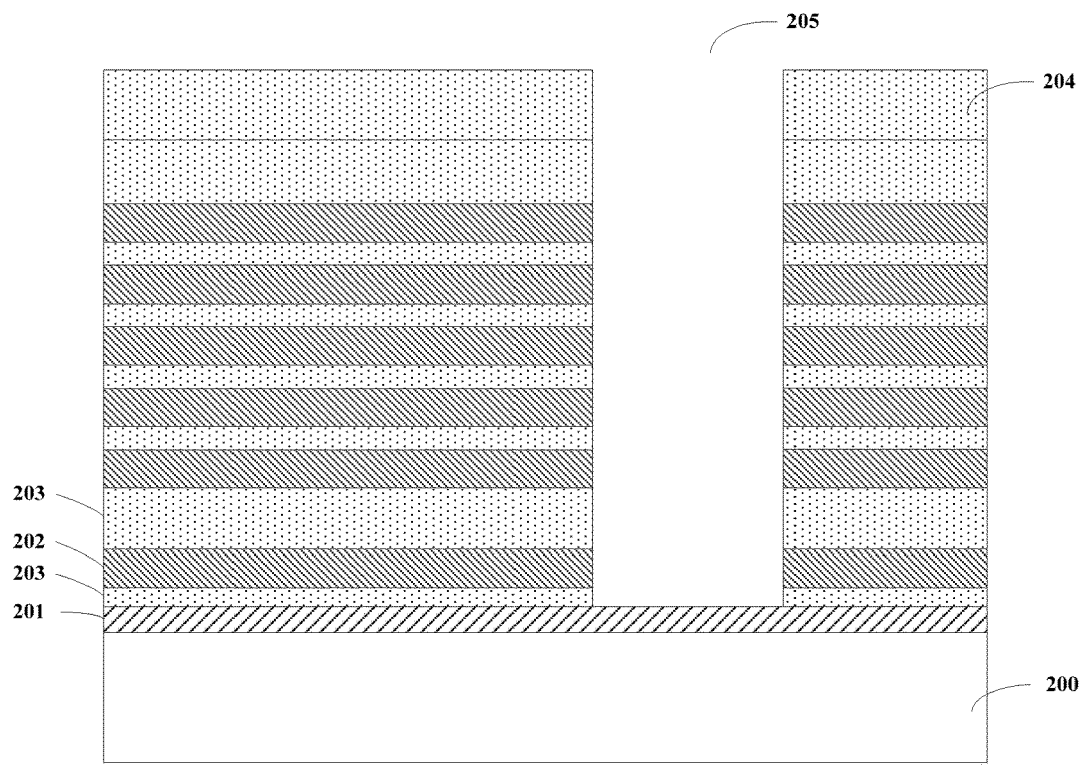

Referring to FIG. 5, a through-hole 205 is formed by etching the sacrificial layers 202 and the interval insulation layers 203 until the upper surface of the bottom interface layer 201 is exposed.

Then a channel structure is formed in the through-hole 205.

Figure 6:
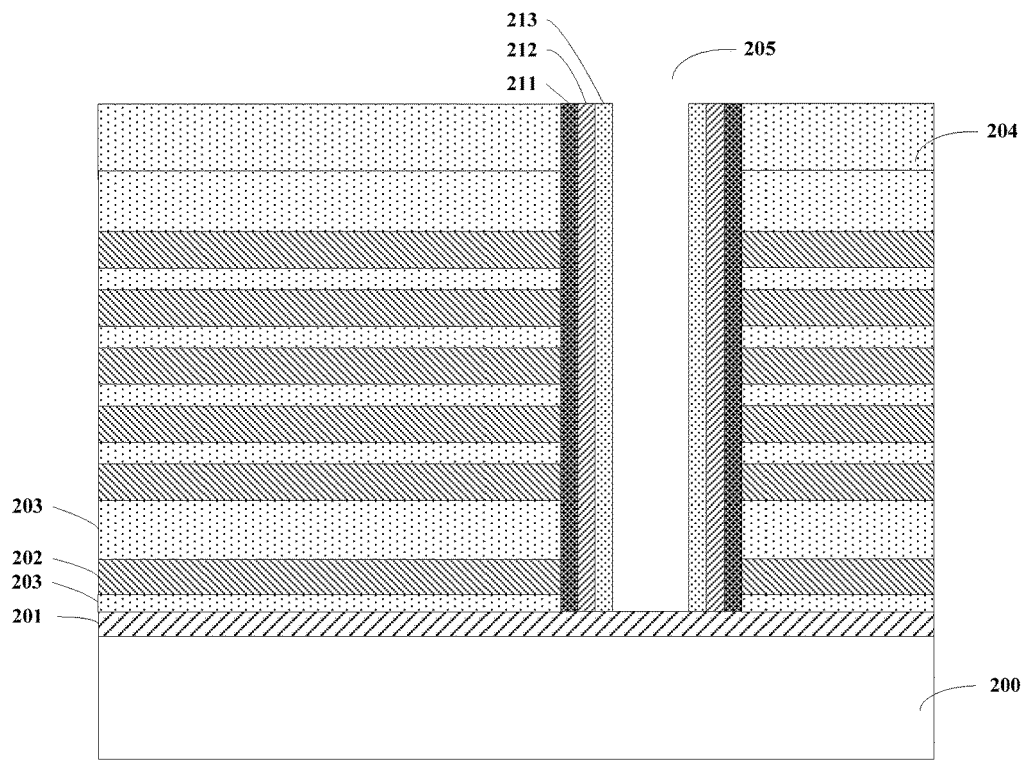

Referring to FIG. 6, in one embodiment, forming a channel structure in the through-hole comprises: forming a blocking layer 211 on a side surface of the through-hole 205 by Atomic Layer Deposition (ALD); forming a charge capture layer 212 on a side surface of the blocking layer 211 by ALD; and forming a tunnel insulation layer 213 on a side surface of the charge capture layer 212 by ALD. In another embodiment, the blocking layer 211, the charge capture layer 212, and the tunnel insulation layer 213 may be first deposited, in that order, on the bottom and side of the through-hole 205, then an etch-back process is conducted on the blocking layer 211, the charge capture layer 212, and the tunnel insulation layer 213 to expose the upper surface of the bottom interface layer 201. The blocking layer 211 may be made of silicon-based oxide, the charge capture layer 212 may be made of silicon-based nitride, and the tunnel insulation layer 213 may be made of silicon-based oxide. The blocking layer 211, the charge capture layer 212 and the tunnel insulation layer 213 together form an Oxide-Silicon Nitride-Oxide (ONO) compound. Optionally, forming the channel structure may further comprise performing an annealing treatment, such as a spike annealing treatment, on the blocking layer 211, the charge capture layer 212, and the tunnel insulation layer 213.

Figure 7:
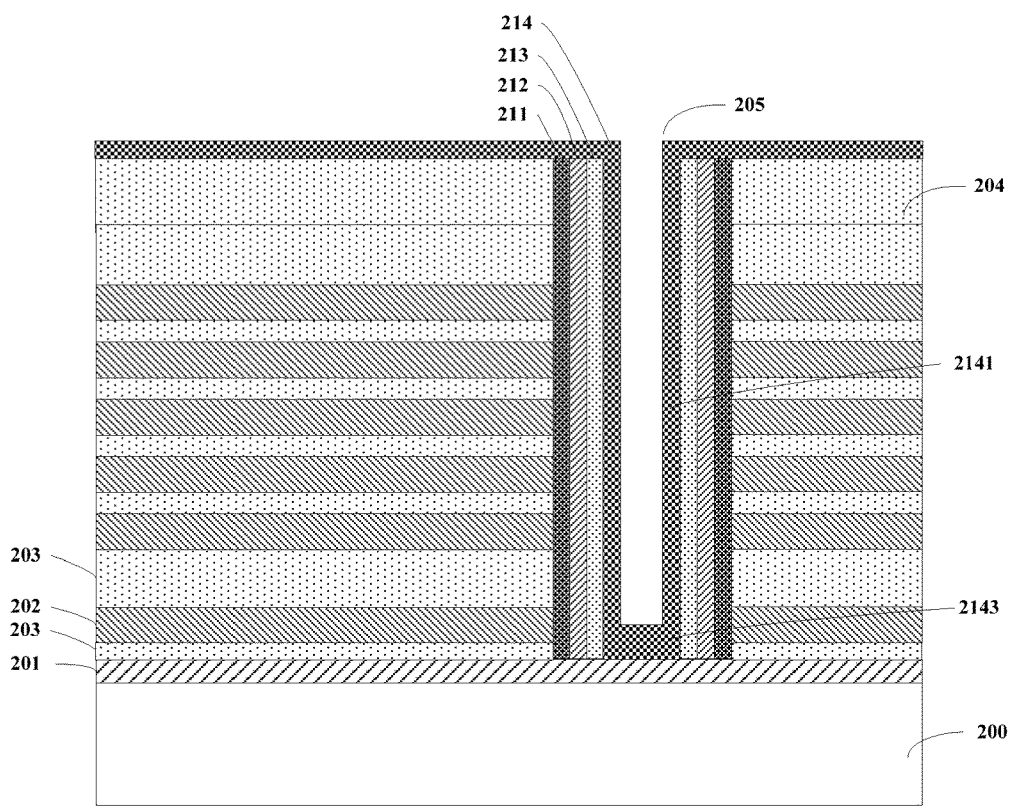

Referring to FIG. 7, forming a channel structure in the through-hole may further comprise forming a channel layer 214 on a side surface of the tunnel insulation layer 213 and the bottom of the through-hole 205 by a low temperature deposition process. The channel layer 214 comprises a first component 2141 substantially perpendicular to the upper surface of the substrate 200 and a third component 2143 underneath the first component 2141. The temperature range of the low temperature deposition process may be from 350 to 400 Celsius degree. For example, the temperature may be set at 380 Celsius degree. The channel layer 214 may be an N-type polycrystalline silicon layer or an N-type doped SiGe layer. The bottommost sacrificial layer 202 horizontally wraps around the third component 2143, thus, when a plurality of gate structures are formed in the succeeding stages, the bottommost gate structure also wraps around the third component 2143.

Figure 8:
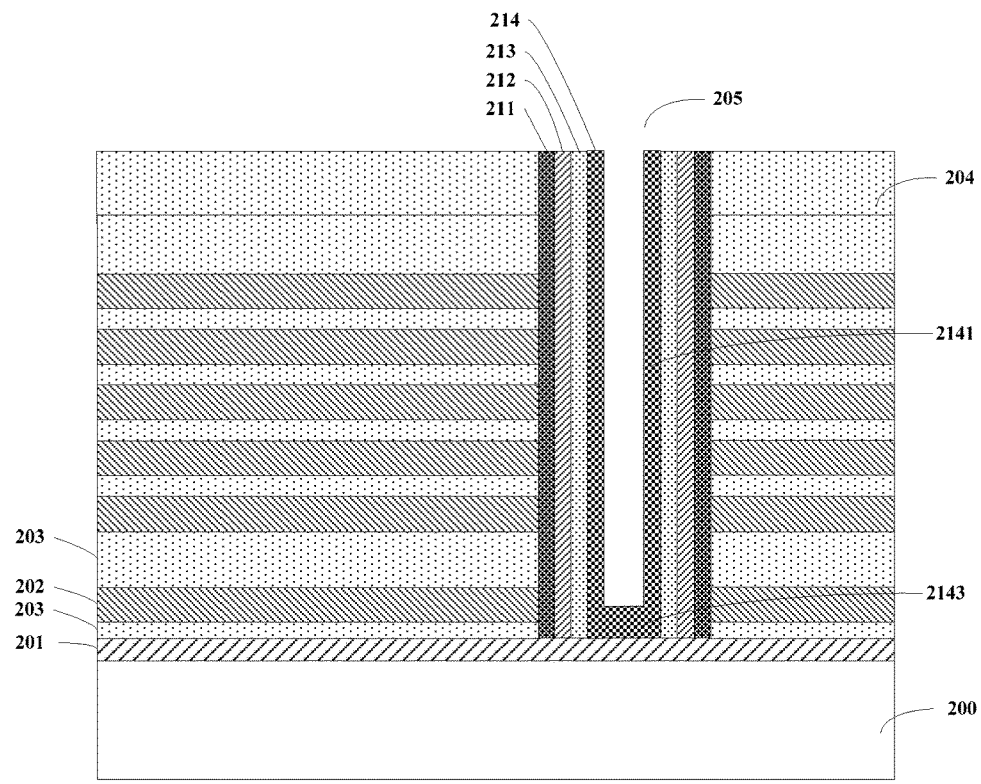

Referring to FIG. 8, a portion of the channel layer 214 on the dielectric layer 204 is removed by a regular CMP process (i.e., filling a sacrificial layer in the through-hole 205 and on a top surface of the channel layer 214; removing a portion of the channel layer 214 on the dielectric layer 204 by a CMP process; removing the sacrificial layer inside the through-hole 205; and cleaning the through-hole 205).

Figure 9:
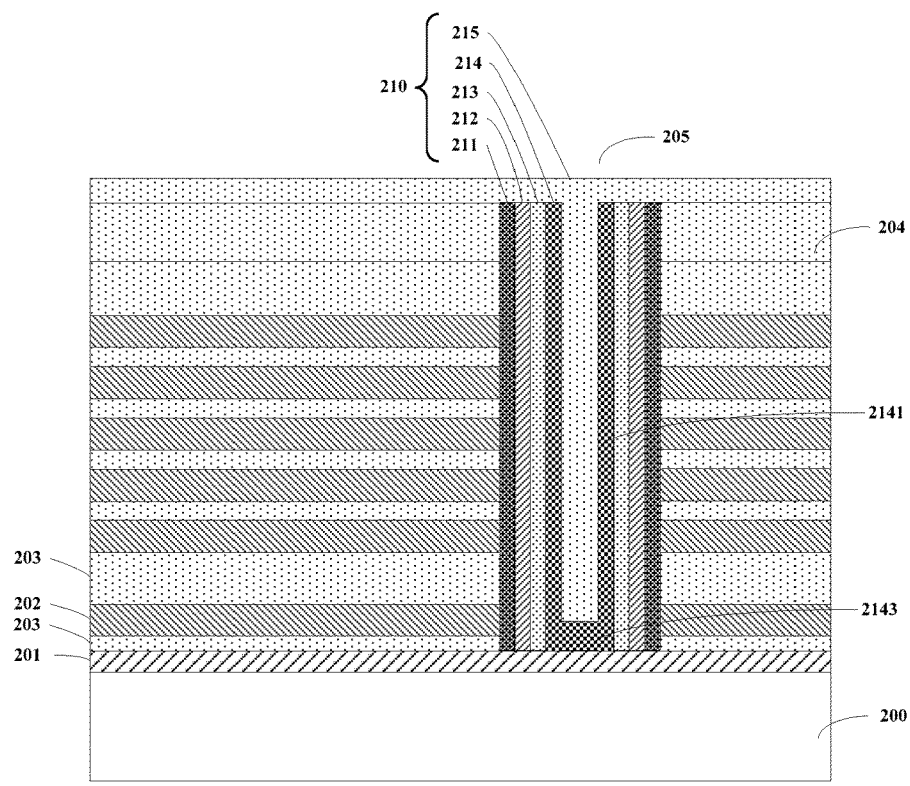
Figure 10:
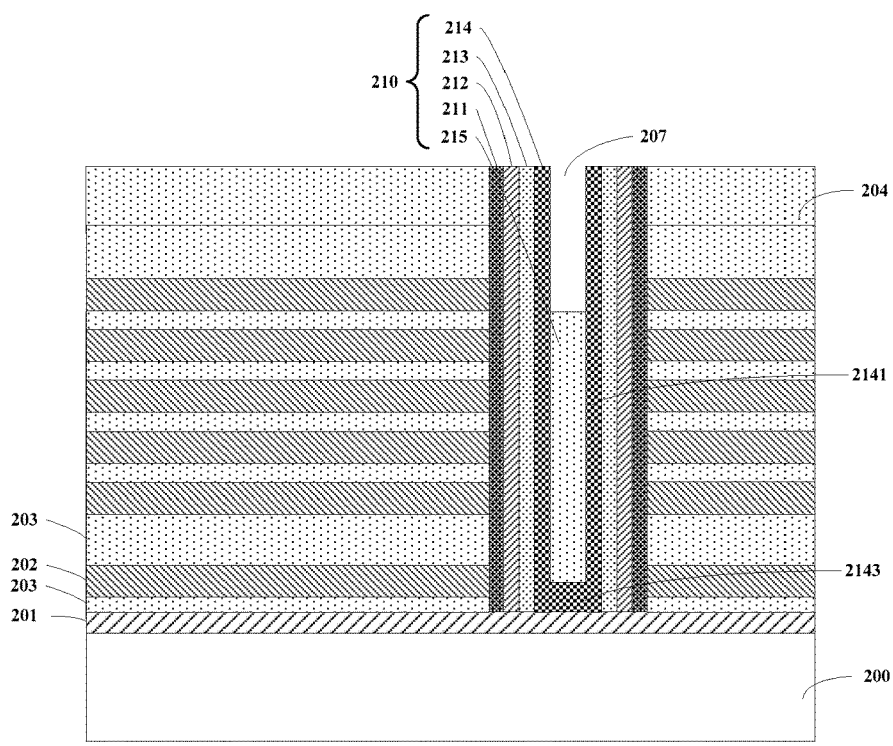

Referring to FIGS. 9 and 10, forming a channel structure in the through-hole may further comprise forming a channel kernel 215 partially filling the through-hole 205 on the channel layer 214. An upper surface of the channel kernel 215 is lower than an upper surface of the topmost sacrificial layer 202. In one embodiment, the channel kernel 215 is first formed by filling the through-hole 205 by silicon oxide deposition, followed by forming a channel cavity 207 by etching (using an etch-back process or a depression treatment) the channel kernel 215 so that the upper surface of the channel kernel 215 is lower than the upper surface of the topmost sacrificial layer 202.

Figure 11:
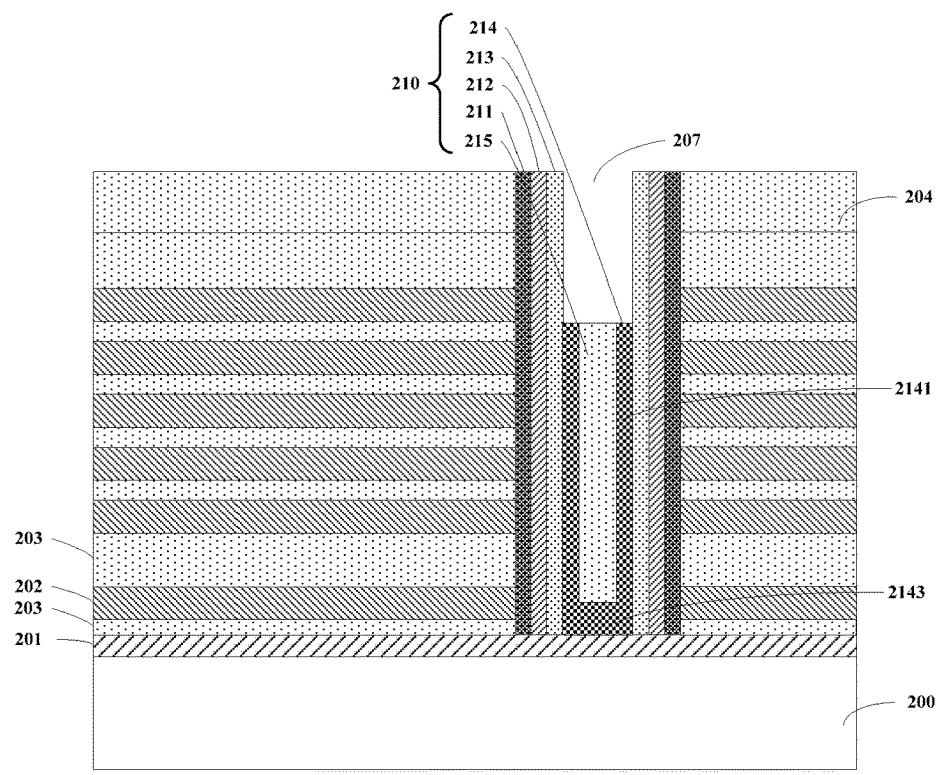

Referring to FIG. 11, forming a channel structure in the through-hole may further comprise removing a portion of the channel layer 214 higher than the channel kernel 215 by a wet etching process conducted on the composing material of either N-type polycrystalline silicon or N-type doped SiGe.

Figure 12:
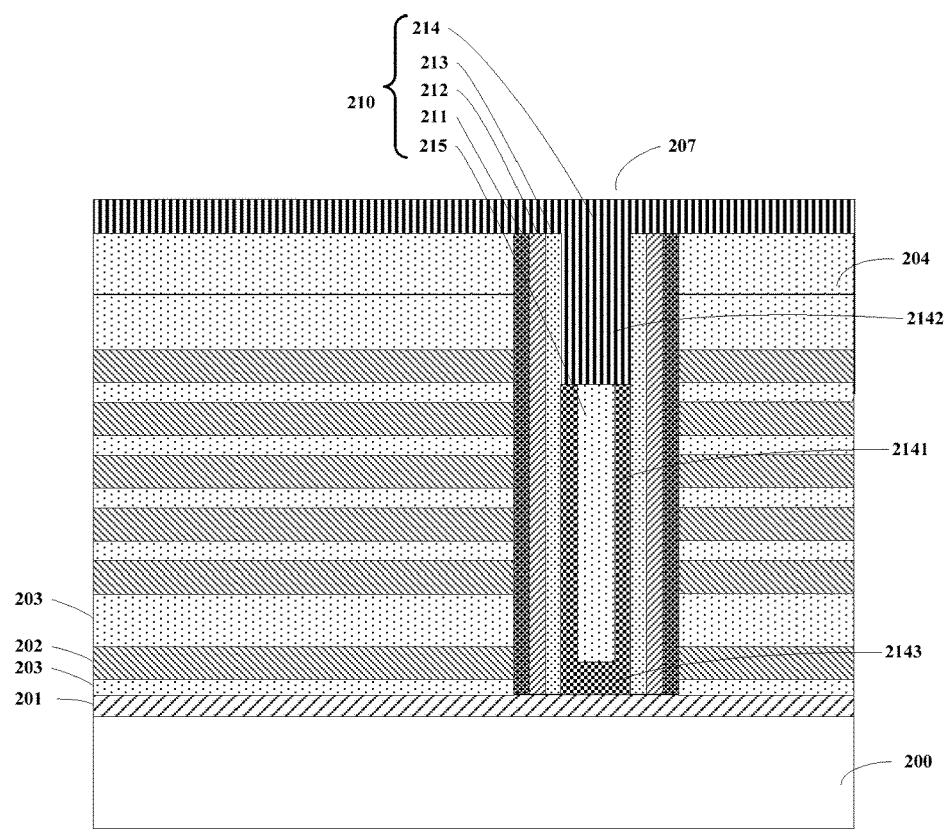
Figure 13:
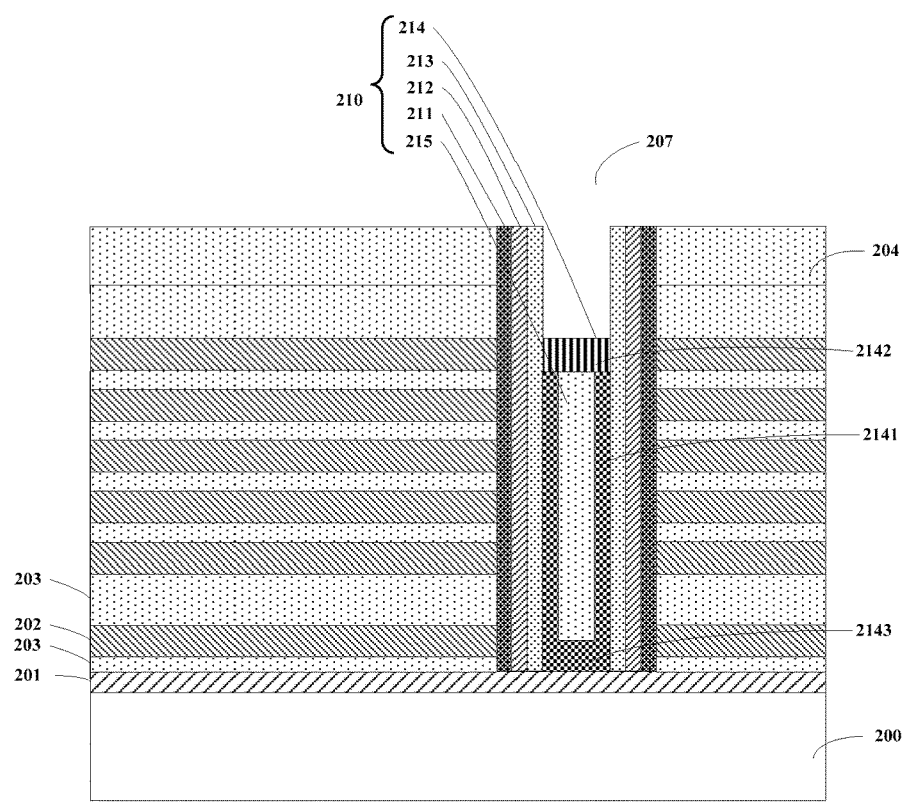

Referring to FIGS. 12 and 13, forming a channel structure in the through-hole may further comprise: forming a second component 2142 of the channel layer 214 connecting to the first component 2141 of the channel layer 214 on the channel kernel 215. Referring to FIG. 12, in one embodiment, the second component 2142 is formed by filling the channel cavity 207 by a low temperature deposition process, wherein the second component 2142 is connected to the first component 2141. The temperature range of the low temperature deposition process may be from 350 to 400 Celsius degree. For example, the temperature may be set at 380 Celsius degree. The second component 2142 may be a P-type polycrystalline silicon layer or a P-type SiGe layer. Referring to FIG. 13, a portion of the second component 2142 is then removed by an etch-back process or a depression treatment so that the remaining second component 2142 partially fills the channel cavity 207. This forms the channel structure 210 in accordance with one or more embodiments of this inventive concept. This channel structure 210 comprises the blocking layer 211, the charge capture layer 212, the tunnel insulation layer 213, the channel layer 214 and the channel kernel 215.

Figure 14:
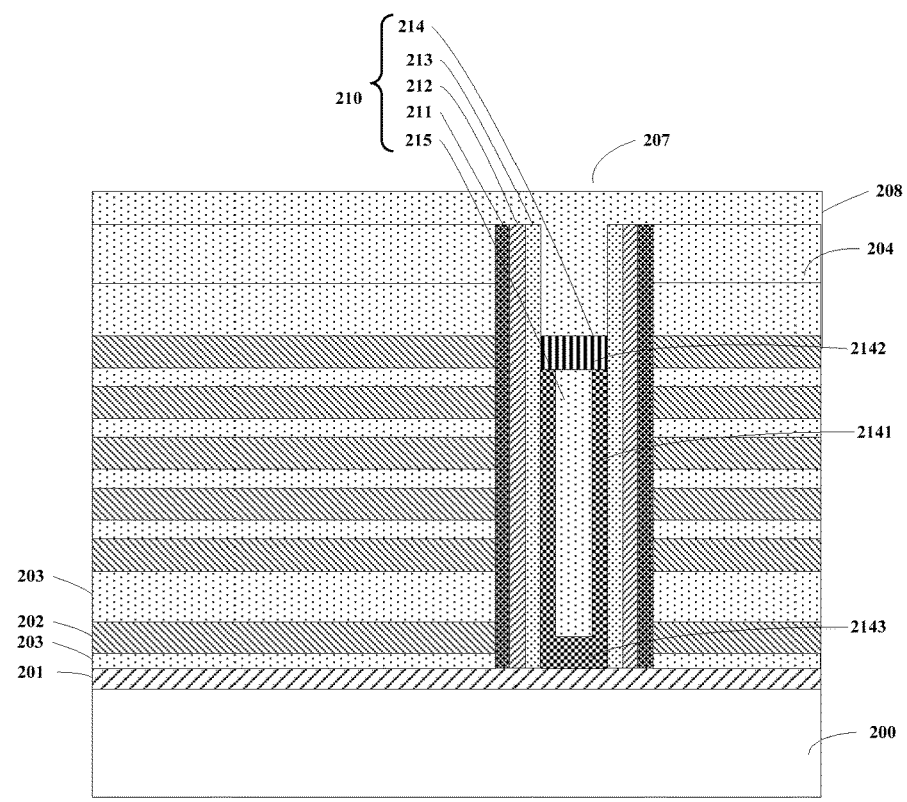

Referring to FIG. 14, optionally, forming a channel structure in the through-hole may further comprise, after the second component 2142 is formed, depositing a top insulation layer 208 covering the second component 2142 and conducting an etch-back process on the top insulation layer 208.

Figure 15:
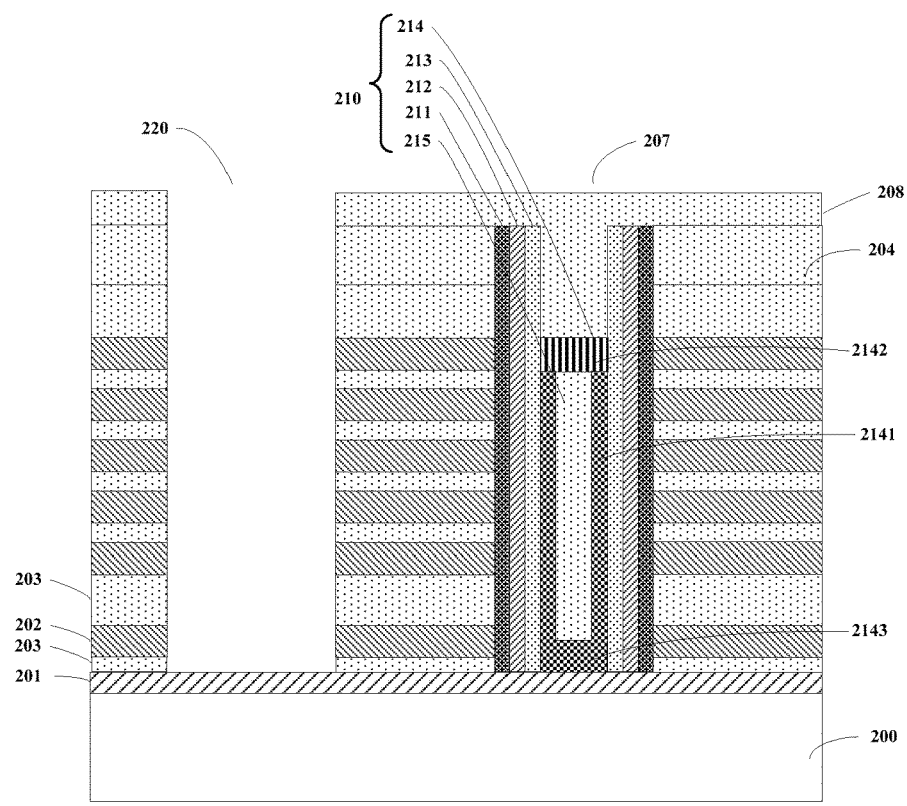

Referring to FIG. 15, a channel groove 220 is formed by etching the sacrificial layers 202 and the interval insulation layers 203 until the upper surface of the bottom interface layer 201 is exposed. The channel groove 220 may separate multiple memory units formed on the substrate 200, wherein each memory unit comprises a channel structure.

Figure 16:
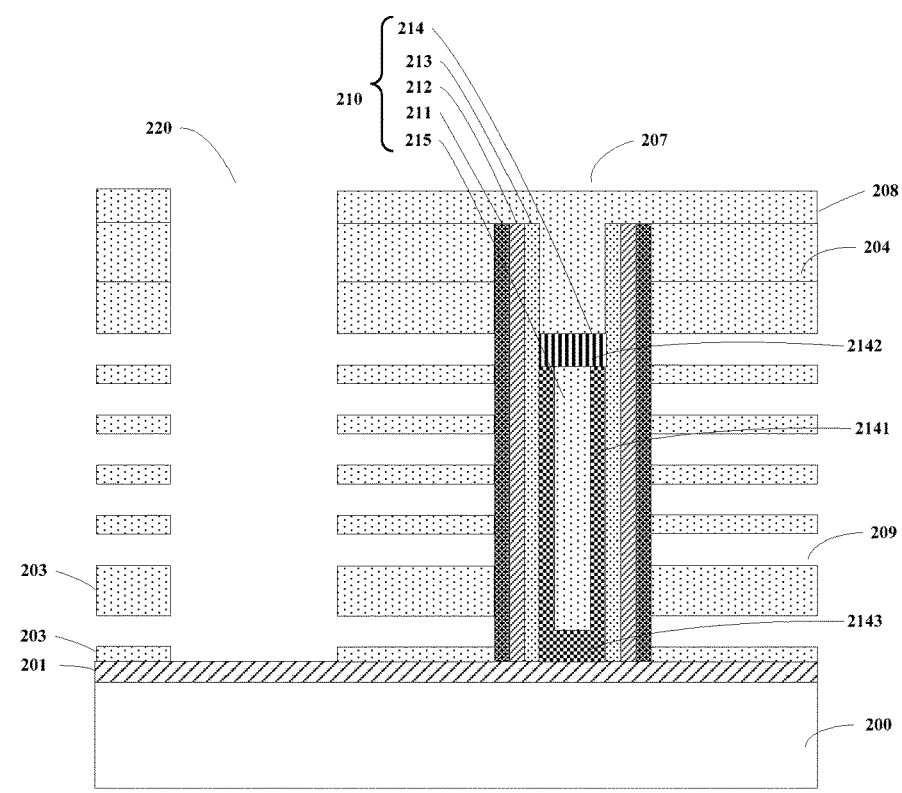

Referring to FIG. 16, a plurality of interval cavities 209 are formed by etching the sacrificial layers 202 (e.g., silicon nitride).

Figure 17:
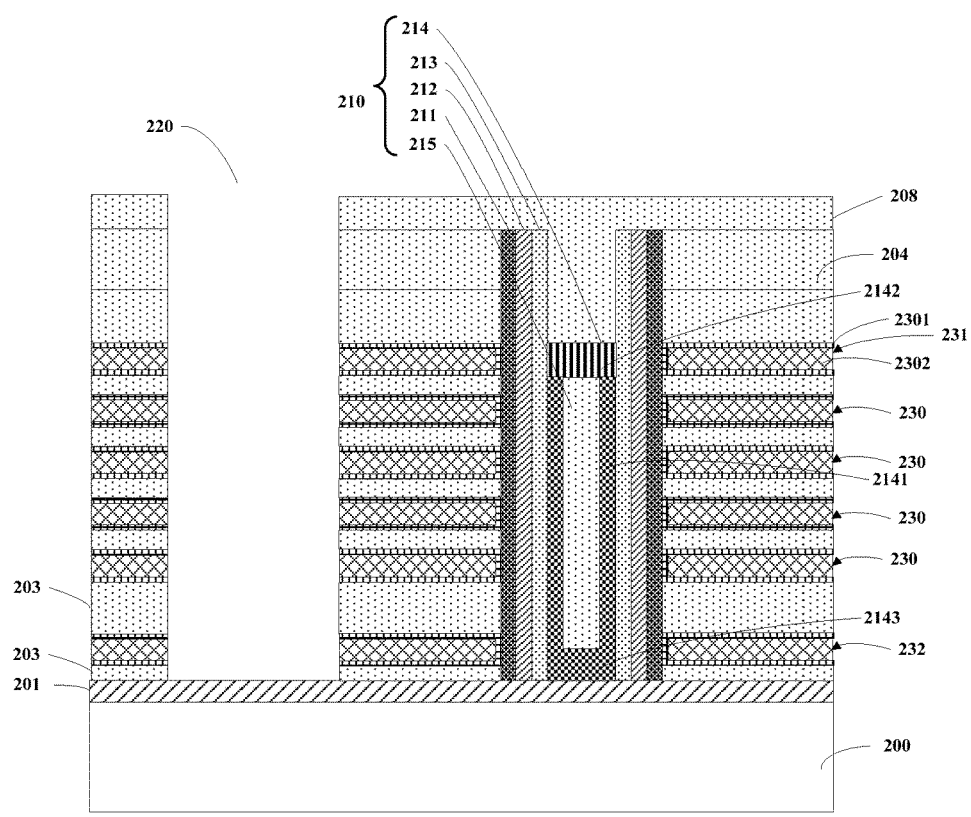

Referring to FIG. 17, a plurality of gate structures, including a topmost gate structure 231, a bottommost gate structure 232, and middle gate structures 230, are formed in the interval cavities 209. The topmost gate structure 231 horizontally wraps around the second component 2142 of the channel layer 214.

Each gate structure may comprise a gate 2302 wrapped around the channel structure 210 and a gate function regulation layer 2301 on the gate 2302, with a portion of the gate function regulation layer 2301 located between the gate 2302 and the channel structure 210. The gate 2302 may be made of a metallic material such as tungsten and the gate function regulation layer 2301 may be made of titanium carbide (TiC) or titanium nitride (TiN). In some embodiments, a portion of the gate structure, including the gate 2302 and the gate function regulation layer 2301, may be formed in the channel groove 220, therefore this manufacturing method may further comprise performing an etch-back process in the channel groove 220 to remove the portion the gate structure in the channel groove 220.

Figure 18:
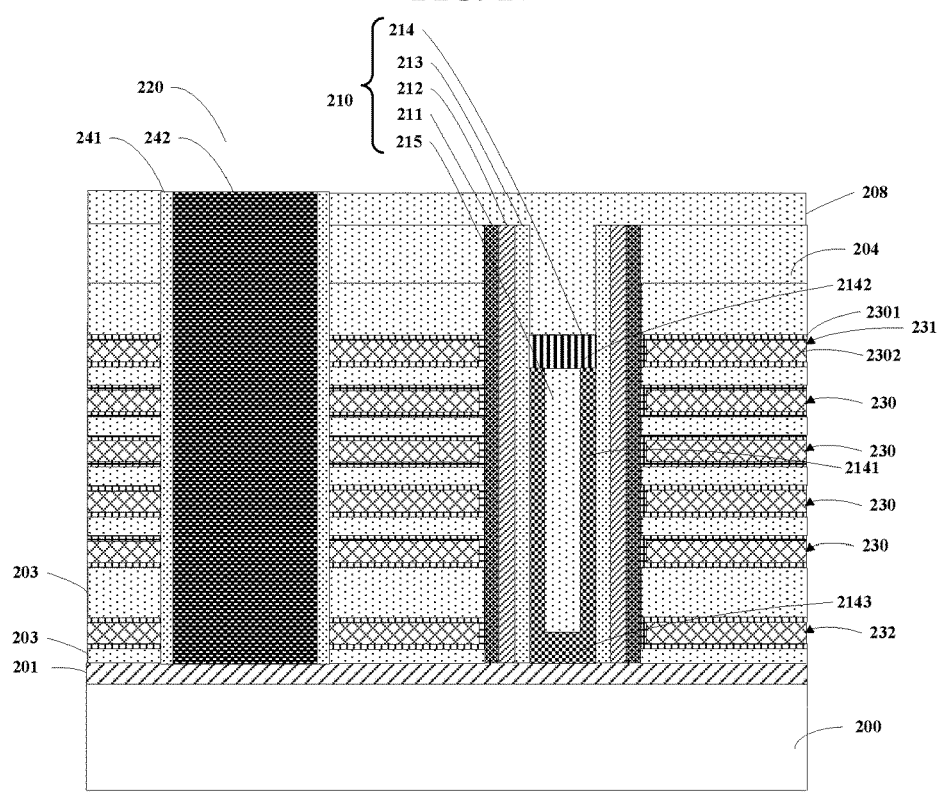

Referring to FIG. 18, a sidewall interval layer 241 is formed on a side surface of the channel groove 220. Forming a sidewall interval layer 241 may comprise depositing a sidewall interval layer on the side surface and the bottom the channel groove 220; and performing an etch-back process in the channel groove 220 to remove a portion of the sidewall interval layer 241 on the bottom of the channel groove 220. The sidewall interval layer 241 may be made of silicon dioxide. After the sidewall interval layer 241 is formed, a metal contact component 242 connecting to the bottom interface layer 201 may be formed in the channel groove 220 by Chemical Vapor Deposition (CVD). The metal contact component 242 may be made of a metallic material such as tungsten. Optionally, a CMP planarization process may be conducted on the metal contact component 242.

Figure 19:
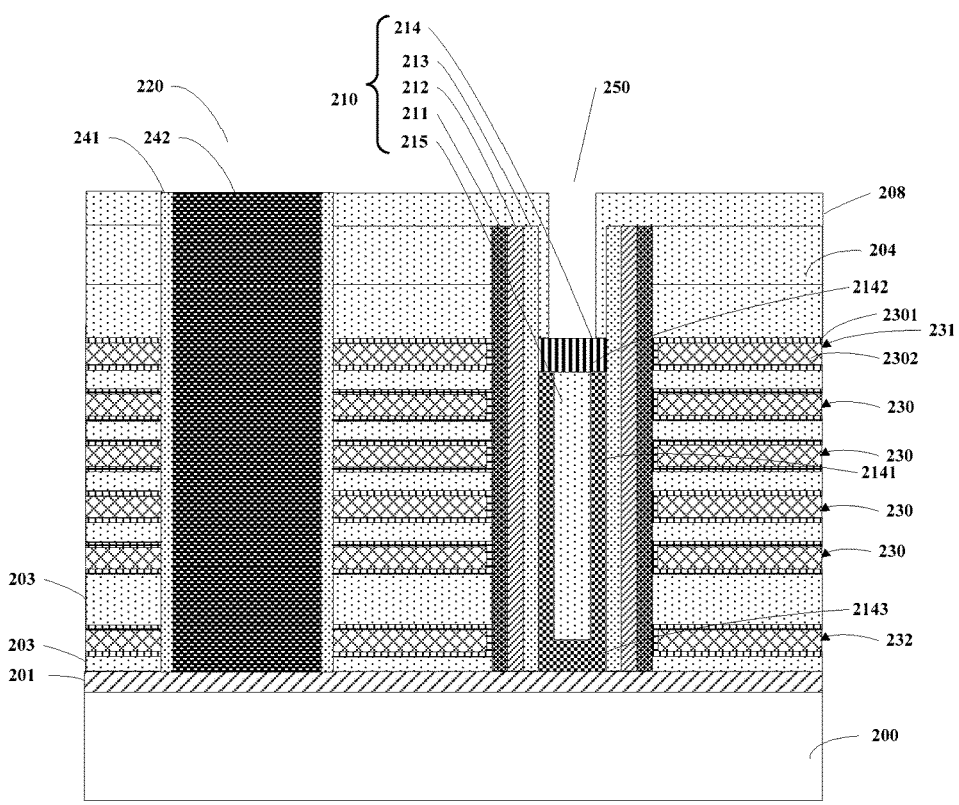
Figure 20:
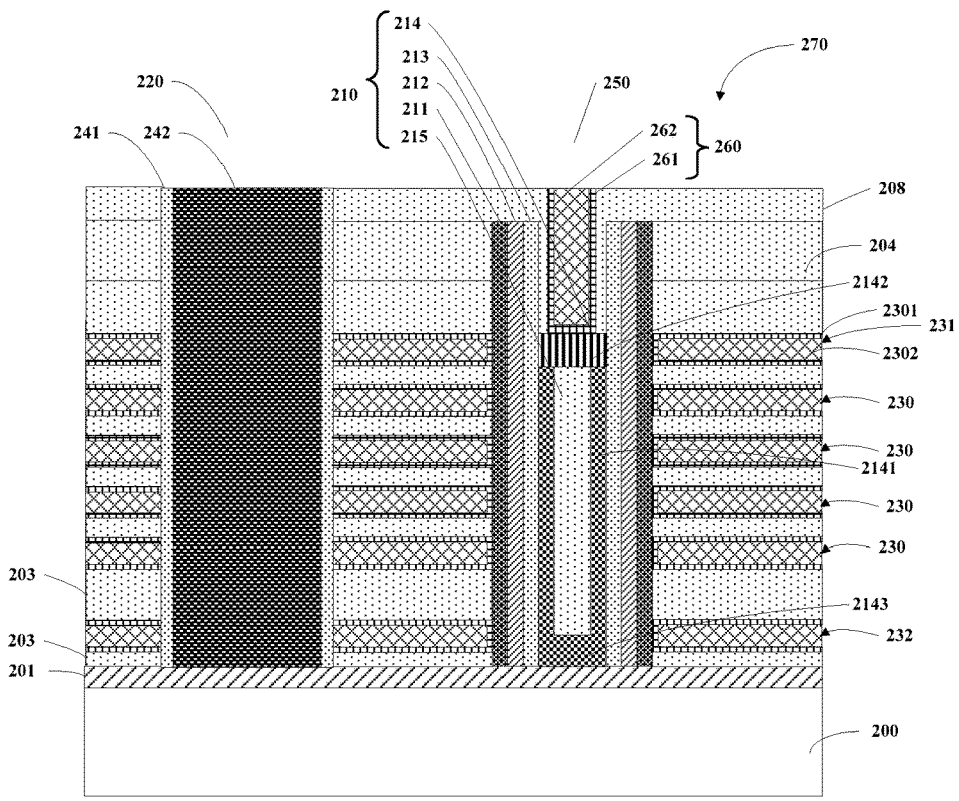

Referring to FIGS. 19 and 20, a channel contact component 260 connecting to the second component 2142 of the channel layer 214 is formed, wherein the channel contact component 260 and the second component 2142 of the channel layer 214 form a Schottky contact. Forming the channel contact component 260 comprises: forming an opening 250 exposing an upper surface of the second component 2142 of the channel layer 214 by etching the top insulation layer 208; and forming the channel contact component 260 in the opening 250. The channel contact component 260 may comprise a top interface layer 261 contacting the second component 2142 of the channel layer 214 and a metal filling layer 262 on the top interface layer 261. The top interface layer 261 may be made of titanium nitride (TiN), titanium carbide (TiC) or titanium aluminum alloy (TiAl), and the metal filling layer 262 may be made of a metallic material such as tungsten.

In some embodiments, the manufacturing method may further comprise forming gate contact components connecting to the gate structures. The gate contact components may be formed by existing techniques.

This concludes the description of a flash memory manufacturing method in accordance with one or more embodiments of this inventive concept.

This inventive concepts also presents a flash memory device. Referring to FIG. 20, this flash memory device comprises a substrate 200 and a memory unit 270 on the substrate 200. The substrate 200 may be a silicon substrate or a dielectric layer.

Referring to FIG. 20, the memory unit 270 may comprise a channel structure 210 on the substrate 200. The channel structure 210 comprises, sequentially from inner to outer of the channel structure 210, a channel layer 214, a tunnel insulation layer 213 wrapped around the channel layer 214, a charge capture layer 212 wrapped around the tunnel insulation layer 213, and a blocking layer 211 wrapped around the charge capture layer 212. The channel layer 214 comprises a first component 2141 substantially perpendicular to an upper surface of the substrate 200 and a second component 2142 on the first component 2141. Optionally, the channel layer 214 may further comprise a third component 2143 underneath the first component 2141.

The channel layer 214 may be made of polycrystalline silicon, the tunnel insulation layer 213 may be made of silicon-based oxide, the charge capture layer 212 may be made of silicon-based nitride, and the blocking layer 211 may be made of silicon-based oxide.

In some embodiments, the charge capture layer 212 may either completely or partially wrap around the tunnel insulation layer 213.

Optionally, the channel structure 210 may further comprise a channel kernel 215 being wrapped by the channel layer 214, and the channel kernel 215 may be made of silicon-based oxide.

Referring to FIG. 20, the memory unit 270 may further comprise a plurality of gate structures, including a topmost gate structure 231, a bottommost gate structure 232, and middle gate structures 230, wrapped around the channel structure 210 and arranged along a symmetry axis of the channel structure 210. The topmost gate structure 231 wraps around the second component 2142 of the channel layer 214. Optionally, the bottommost gate structure 232 wraps around the third component 2143 of the channel layer 214. Each gate structure may comprise a gate 2302 wrapped around the channel structure 210 and a gate function regulation layer 2301 on the gate 2302, with a portion of the gate function regulation layer 2301 located between the gate 2302 and the channel structure 210.

Referring to FIG. 20, the memory unit 270 may further comprise a channel contact component 260 connecting to the second component 2142 of the channel layer 214. The channel contact component 260 and the second component 2142 of the channel layer 214 form a Schottky contact.

In the flash memory device of this inventive concept, a Schottky contact is formed in a topmost transistor comprising the topmost gate structure 231. That is, the channel contact component 260 and the second component 2142 of the channel layer 214 form a Schottky barrier, which reduces the leakage current. Additionally, when the topmost transistor is powered up, the Schottky contact becomes an Ohm contact, which exerts further control over the leakage current.

In one embodiment, the conduction types of the first component 2141 and the second component 2142 of the channel layer 214 are opposite to each other. For example, the conduction types of the first component 2141 and the second component 2142 of the channel layer 214 may be N-type and P-type, respectively, or P-type and N-type, respectively. Since the conduction types of the first component 2141 and the second components 2142 of the channel layer 214 are opposite to each other, these two components form a diode that can facilitate the control over the leakage current.

Referring to FIG. 20, in one embodiment, the channel contact component 260 may comprise a top interface layer 261 contacting the second component 2142 of the channel layer 214 and a metal filling layer 262 on the top interface layer 261. The conduction type of the second component 2142 of the channel layer 214 may be P-type, and the top interface layer 261 may be a P-type work function regulation layer made of titanium nitride (TiN). In another embodiment, the conduction type of the second component 2142 of the channel layer 214 may be N-type, and the top interface layer may be an N-type work function regulation layer made of titanium carbide (TiC) or titanium aluminum alloy (TiAl). The work function regulation layer and the second component 2142 of the channel layer 214 form a Schottky contact, which further facilitates the control over the leakage current.

Referring to FIG. 2, optionally, the flash memory device may further comprise a bottom interface layer 201 on a portion of the substrate 200. The bottom interface layer 201 may be embedded in the substrate 200 and an upper surface of the bottom interface layer 201 is on a substantially same horizontal level with an upper surface of the substrate 200, as shown in FIG. 2. The bottom interface layer 201 may comprise a work function regulation layer. A portion of the memory unit 270 is on the bottom interface layer 201, with the channel layer 214 contacting the bottom interface layer 201. For example, the third component 2143 of the channel layer 214 may contact the bottom interface layer 201. The channel layer 214 and the bottom interface layer 201 may form a Schottky contact, which reduces the leakage current and facilitates the control over the leakage current.

Additionally, in this embodiment, the bottom interface layer 201 formed in the substrate 200 may work as a source electrode or a drain electrode, which eliminates the need to, as in conventional manufacturing methods, dope the substrate 200 to form a source electrode or a drain electrode. As a result, the flash memory device of this inventive concept can be made on top of a dielectric layer with low process temperature (i.e., in a thermal budget compatible with BEOL). This is significant in that this inventive flash memory technology can be formed on top of logic circuits with minimum alterations to logic characteristics. This also serves as a 3D stacking technology of 3D NAND monolithically stacking over logic circuits.

In one embodiment, the conduction type of the first component 2141 of the channel layer 214 is N-type and the bottom interface layer 201 may comprise an N-type work function regulation layer made of titanium carbide (TiC) or titanium aluminum alloy (TiAl). In another embodiment, the conduction type of the first component 2141 of the channel layer 214 is P-type and the bottom interface layer 201 may comprise a P-type work function regulation layer made of titanium nitride (TiN).

In one embodiment, the memory unit 270 may further comprise an interval insulation layer 203 located between the neighboring gate structures. The interval insulation layer 203 may be made of silicon dioxide.

In one embodiment, the memory unit 270 may further comprise a dielectric layer 204 on the interval insulation layer 203. The dielectric layer 204 may be made of silicon dioxide.

In one embodiment, the memory unit 270 may further comprise a top insulation layer 208 on the dielectric layer 204 wrapped around the channel contact component 260. The top insulation layer 208 may be made of silicon dioxide.

In one embodiment, the flash memory device may comprise a plurality of memory units 270 separating from each other, a metal contact component 242 connecting to the bottom interface layer 201 and located between the neighboring memory units 270, and a sidewall interval layer 241 separating the metal contact component 242 from the gate structures. The metal contact component 242 may be made of a metallic material such as tungsten, and the sidewall interval layer 241 may be made of silicon dioxide.

A data writing process of the flash memory device of this inventive concept is briefly described below. In this inventive concept, the channel layer 214 forms a Schottky contact with the channel contact component 260 on the top and the bottom interface layer 201 on the bottom. To write a data into a certain memory unit, the metal contact component 242, the channel contact component 260, the topmost gate structure 231, and the bottommost gate structure 232 in that memory unit will be powered up, so that two Schottky contacts in this memory unit become Ohm contacts, which allows work current to pass through the channel layer 214. When one of the gate structures of this memory unit is powered up, some charge carriers, such as electronic, can tunnel through the tunnel insulation layer and reach the charge capture layer to write the data into the memory unit.

This concludes the description of a flash memory device in accordance with one or more embodiments of this inventive concept.

While this inventive concept has been described in terms of several embodiments, there are alterations, permutations, and equivalents, which fall within the scope of this disclosure. It shall also be noted that there are alternative ways of implementing the methods and apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A method for manufacturing a flash memory device, comprising:

providing a substrate;

forming a plurality of sacrificial layers and a plurality of interval insulation layers on the substrate, with the sacrificial layers and the interval insulation layers stacking over each other alternately;

forming a through-hole by etching the sacrificial layers and the interval insulation layers until an upper surface of the substrate is exposed;

forming a channel structure in the through-hole, wherein the channel structure comprises, sequentially from inner to outer of the channel structure, a channel layer, a tunnel insulation layer wrapped around the channel layer, a charge capture layer wrapped around the tunnel insulation layer, and a blocking layer wrapped around the charge capture layer, wherein the channel layer comprises a first component substantially perpendicular to the upper surface of the substrate and a second component on the first component;

forming a plurality of interval cavities by removing the sacrificial layers;

forming a plurality of gate structures in the interval cavities, with a topmost gate structure wrapped around the second component of the channel layer; and forming a channel contact component contacting the second component of the channel layer, wherein the channel contact component and the second component of the channel layer form a Schottky contact.

2. The method of claim 1, wherein the conduction types of the first component and the second component of the channel layer are opposite to each other.

3. The method of claim 1, wherein the conduction types of the first component and the second component of the channel layer are N-type and P-type, respectively, or P-type and N-type, respectively.

4. The method of claim 1, wherein the channel layer is made of polycrystalline silicon, the tunnel insulation layer is made of silicon-based oxide, the charge capture layer is made of silicon-based nitride, and the blocking layer is made of silicon-based oxide.

5. The method of claim 1, wherein the channel contact component comprises:
  a top interface layer contacting the second component of the channel layer; and
  a metal filling layer on the top interface layer.

6. The method of claim 5, wherein the conduction type of the second component of the channel layer is P-type and the top interface layer is a P-type work function interface layer, or, the conduction type of the second component of the channel layer is N-type and the top interface layer is an N-type work function interface layer.

7. The method of claim 1, wherein the channel layer further comprises a third component underneath the first component, with a bottommost gate structure wrapped around the third component.

8. The method of claim 1, wherein the channel structure further comprises a channel kernel being wrapped by the channel layer.

9. The method of claim 8, wherein forming a channel structure in the through-hole comprises:
  forming the blocking layer on a side surface of the through-hole;
  forming the charge capture layer on a side surface of the blocking layer;
  forming the tunnel insulation layer on a side surface of the charge capture layer;
  forming the channel layer on a side surface of the tunnel insulation layer and the bottom of the through-hole, wherein the channel layer comprises the first component substantially perpendicular to the upper surface of the substrate and a third component underneath the first component;
  forming a channel kernel partially filling the through-hole on the channel layer, wherein an upper surface of the channel kernel is lower than an upper surface of the topmost sacrificial layer;
  removing a portion of the channel layer higher than the channel kernel; and
  forming the second component of the channel layer connecting to the first component of the channel layer.

10. The method of claim 9, wherein forming a channel structure in the through-hole further comprises:
  forming a top insulation layer covering the second component of the channel layer after the second component of the channel layer is formed,
  and wherein forming a channel contact component comprises:
  forming an opening exposing the second component of the channel layer by etching the top insulation layer; and
  forming the channel contact component in the opening.

11. The method of claim 1, further comprises:
  forming a bottom interface layer on a portion of the substrate before the sacrificial layers and the interval insulation layers are formed on the substrate, wherein the bottom interface layer comprises a work function regulation layer, and the sacrificial layers and the interval insulation layers are formed on the bottom interface layer,
  wherein when forming the through-hole, the through-hole exposes an upper surface of the bottom interface layer,
  and wherein when forming the channel structure, the channel layer contacts the bottom interface layer.

12. The method of claim 11, wherein the conduction type of the first component of the channel layer is N-type and the bottom interface layer is an N-type work function interface layer, or, the conduction type of the first component of the channel layer is P-type and the bottom interface layer is a P-type work function interface layer.

13. The method of claim 11, further comprises:
  forming a channel groove exposing the upper surface of the bottom interface layer by etching the sacrificial layers and the interval insulation layers after the channel structure is formed but before the sacrificial layers are removed;
  forming a sidewall interval layer on a side surface of the channel groove after the gate structures are formed but before the channel contact component is formed; and
  forming a metal contact component contacting the bottom interface layer in the channel groove after the sidewall interval layer is formed.

* * * * *